United States Patent [19]

Caule

[11] 4,264,379
[45] Apr. 28, 1981

[54] PROCESS FOR COATING COPPER AND COPPER ALLOY

[75] Inventor: Elmer J. Caule, New Haven, Conn.

[73] Assignee: Olin Corporation, New Haven, Conn.

[21] Appl. No.: 111,207

[22] Filed: Jan. 11, 1980

[51] Int. Cl.³ ............................................. C23F 7/12
[52] U.S. Cl. ................................ 148/6.15 R; 148/6.16
[58] Field of Search ..................... 148/6.15 R, 6.16; 252/389 R, 389 A

[56] References Cited

U.S. PATENT DOCUMENTS

| | | | |
|---|---|---|---|
| 3,293,088 | 12/1966 | Herbst et al. | 148/6.15 R |
| 3,324,908 | 12/1967 | Duch et al. | 148/6.15 R |
| 3,431,217 | 3/1969 | Hwa | 252/389 A |
| 3,510,436 | 5/1970 | Silverstein et al. | 252/389 R |
| 3,630,790 | 12/1971 | Schmidt | 148/6.15 R |
| 3,634,146 | 1/1972 | Wystvach et al. | 148/6.15 R |
| 3,677,828 | 7/1972 | Caule | 148/6.15 R |
| 3,837,929 | 9/1974 | Caule | 148/6.16 |

*Primary Examiner*—Ralph S. Kendall
*Attorney, Agent, or Firm*—Paul Weinstein

[57] ABSTRACT

Copper or copper alloy sheet or foil displaying excellent solderability and high resistance to tarnish is prepared by the provision over its surface of a coating containing a copper salt of an organophosphonic acid. To form the coating, the sheet or foil is immersed for a short time in an aqueous solution containing a phosphonic acid, rinsed and dried, the treatment being combined with or preceded by oxidation of the sheet surface.

15 Claims, No Drawings

PROCESS FOR COATING COPPER AND COPPER ALLOY

BACKGROUND OF THE INVENTION

The present invention relates to copper and copper alloy sheet or foil of significantly improved properties imparted by a novel thin invisible surface coating, and to the method of manufacture of such sheet.

Significant advances in this art have been described in U.S. Pat. No. 3,837,929 issued Sept. 24, 1974 and in related patents such as U.S. Pat. No. 3,677,828 issued July 18, 1972. These disclosures teach the overcoming of difficulties and deficiencies, which were encountered in following earlier teachings, through the provision of a thin glassy surface film of copper phosphate, formed by treatment of the copper or copper alloy substrate with a solution of phosphoric acid or of an alkali phosphate, preceded by or-combined with oxidation of the metal surface. The thus-coated metal sheet displayed a desired high resistance to tarnish and other desired properties.

The attainment of these advantages appears to be based, at least in part, on the formation of a glassy pore-free coating of copper phosphate containing polymeric chains including multiple units of phosphorus atoms linked through intervening oxygen atoms in the surface film, which has a thickness of about 20 to 1,000 Angstrom units.

However, such coating has generally been found to effect a significant decrease in solderability, as compared to the clean uncoated metal sheet, such decrease being an important drawback for some uses. For example, such decrease in solderability detracts appreciably from one of the important advantages intended to be provided in treated electrical connector parts, that of the ready soldering to other circuit components.

It is, therefore, a principal object of this invention to overcome such deficiencies by providing a process resulting in a coated copper or copper alloy sheet, wherein the coated sheet displays high values of solderability, while other desirable properties such as substantial resistance to tarnish are also accomplished.

It is a further object to provide a coated copper or copper alloy sheet or foil, and a method of preparing such coated sheet, wherein the solderability of the sheet is maintained at substantially the initial value of the cleaned sheet prior to the treatment.

It is a further object to provide a coated copper or copper alloy sheet or foil, and a method of preparing such coated sheet, wherein initial properties of the sheet are maintained substantially undiminished or are enhanced.

A further object is to provide a process which will efficiently and inexpensively provide such thin surface coating over a copper or copper alloy sheet or foil.

Further objects and advantages of this invention will become apparent hereinafter.

SUMMARY OF THE INVENTION

In accordance with the present invention, the foregoing objects and advantages are achieved by applying to a copper or copper alloy sheet or foil a solution of an organophosphonic acid, or salt thereof, for 4 to 20 or more seconds at room temperature up to about 100° C., draining off excess solution, rinsing, and drying, the treatment being combined with or preceded by oxidation of the sheet surface.

The organophosphonic acid, structurally an organic substitution product of phosphoric acid, is preferably one in which one of the three hydroxyl groups of phosphoric acid has been replaced by a monovalent hydrocarbon radical, which may be substituted or unsubstituted and which may be saturated or unsaturated, as by including ethylenic or carbonyl bonds. Generally, such organophosphonic acids or salts thereof are characterized as having a hydroxyl group of phosphoric acid replaced by a hydrocarbon radical, a carbon atom of which is linked directly to the phosphorus atom of the acid. Such radicals may include additional substituents which may display C to N or C to O linkages.

Thus, the organo substituent of the phosphonic acid may consist of an alkyl group such as methyl, ethyl, propyl, or higher alkyl; an aryl group such as phenyl, propyl, or higher alkyl; an aryl group such as phenyl, napthyl, or higher aryl; an alkaryl group such as benzyl, phenyl ethyl, or higher; an alkene group such as vinyl, propene, butene, or higher group; an acyl group such as acetyl, propionyl, butyryl, or higher; an alkoxy group such as oxymethyl, oxyethyl or higher; a keto- group such as acetonyl, methyl acetonyl or higher; or a member of any of the above groups which may also include a hydroxyl, amino, or carboxyl substituent. Likewise, mixtures of two or more of the above categories of phosphonic acid are effective to produce the desired coated copper or copper alloy sheet or foil.

The treatment may be effected with an aqueous solution containing a low to moderate concentration of the phosphonic acid component or components, preferably ranging from about 0.1 to about 30 volume percent for liquid acids or corresponding weight percent limits for solid phosphonic acids, preferably in the range of about 0.1 to 40 percent by weight.

The treating solution also preferably includes a low to moderate concentration, such as about 0.1 to about 15.0 percent by weight, preferably 0.2 to 5.0 percent by weight of oxidizing agent, such as sodium or other alkali chromate or dichromate, or nitric acid (100 percent) at a concentration of about 0.05 to about 10.0 volume percent, perferably about 0.05 to about 2.0 percent by volume $HNO_3$. Other known oxidizing agents of similar activity may be used at a comparable dilute or moderate concentration effective for the purpose, but generally with avoidance of such vigorous oxidizing conditions as might cause substantial decomposition of the phosphonic acid.

Furthermore, it may at times be convenient to apply an oxidation step separately, prior to the treatment with the phosphonic acid component or components. Such procedure may be advisable, for instance, in instances where the treating solution shows signs of some instability, as by change in color, when stored in solution in the presence of oxidizing agent.

DETAILED DESCRIPTION OF THE INVENTION

The present invention may be applied with the use of the above reagents and treatments, with the inclusion, if desired, of some procedural steps as described in the patents referred to above. For example, the copper or copper alloy sheet or foil may be surface roughened prior to the formation of the improved surface coating.

The following illustrative examples in accordance with the invention provide specific details of procedure furnishing the desired advantageous results.

The copper or copper alloy strips treated in the following examples were selected from the following known compositions. The strips were cleaned and degreased by swabbing with reagent grade benzene or chlorinated hydrocarbon, before treatment in the following examples, which involved the use of the organophosphonic acid, or salt thereof, listed below.

| No. | Organophosphonic Acid | Structure |
|---|---|---|
| 1 | Methylphosphonic Acid | $CH_3-\overset{\overset{O}{\|\|}}{\underset{\underset{OH}{\|}}{P}}-OH$ |
| 2 | Ethylphosphonic Acid | $CH_3-CH_2-\overset{\overset{O}{\|\|}}{\underset{\underset{OH}{\|}}{P}}-OH$ |
| 3 | Acetylphosphonic Acid | $CH_3-\overset{\overset{O}{\|\|}}{C}-\overset{\overset{O}{\|\|}}{\underset{\underset{OH}{\|}}{P}}-OH$ |
| 4 | Propionylphosphonic Acid | $CH_3-CH_2-\overset{\overset{O}{\|\|}}{C}-\overset{\overset{O}{\|\|}}{\underset{\underset{OH}{\|}}{P}}-OH$ |
| 5 | Hydroxyethylidene Diphosphonic Acid ("DEQUEST" 2010)* | $HO-\overset{\overset{O}{\|\|}}{\underset{\underset{OH}{\|}}{P}}-\overset{\overset{CH_3}{\|}}{\underset{\underset{OH}{\|}}{C}}-\overset{\overset{O}{\|\|}}{\underset{\underset{OH}{\|}}{P}}-OH$ |
| 6 | Ethylenediamine Tetra(Methylenephosphonic Acid) ("DEQUEST" 2041)* | (structure with $N(CH_2)_2N$ core and four $-CH_2-P(O)(OH)_2$ groups) |
| 7 | Hexamethylenediamine Tetra(methylenephosphonic Acid) ("DEQUEST" 2051)* | (structure with $N(CH_2)_6N$ core and four $-CH_2-P(O)(OH)_2$ groups) |

*Product of Monsanto Chemical Corp.

| C.D.A. Alloy No. | Composition |
|---|---|
| 110 | 99.90 percent Cu (min.), 0.04 percent O. |
| 194 | 2.1–2.6 Fe, 0.05–0.2 Zn, 0.01–0.04 P, balance Cu. |
| 195 | 1.3–1.7 Fe, 0.6–1.0 Co, 0.4–0.7 Sn, 0.08–0.12 P, balance Cu. |
| 260 | 68.5–71.5 Cu, balance Zn. |

The strips had a thickness of 0.25 to 6.0 mils (thousandths of an inch), a width of 0.5 to 0.75 inch and length of 1.5 to 2.0 inches, and were in the annealed condition.

It will be noted that in the above organophosphonic acids, one of the three hydroxyl groups in phosphoric acid has been replaced by an organic radical having a carbon atom linked directly to at least one phosphorus atom. Further, some of the above acids display a linkage of carbon to nitrogen or a linkage of carbon to oxygen in the organo radical. The reagents may be added in the form of salts, such as the alkali metal or ammonium salt, to the treating solution, which is maintained acidic, so that the treatment of the metal surface is effected with the corresponding organophosphonic acid.

Reagents and conditions for the specific examples are listed in the following Table I.

TABLE I

Specific Examples

| Example | Organophosphonic Acid No. | Concn. | C.D.A. Alloy | | Oxidizer Concn. | | Temp. (°C.) | Time (Secs.) |
|---|---|---|---|---|---|---|---|---|
| 1 | 1 | 18% (wt.) | 110 | A* | 3% | (wt.) | 25° | 15 |
| 2 | 2 | 18% (wt.) | 110 | A | 3% | (wt.) | 25° | 15 |
| 3 | 3 | 18% (wt.) | 110 | A | 3% | (wt.) | 25° | 15 |
| 4 | 4 | 18% (wt.) | 110 | A | 3% | (wt.) | 60° | 10 |
| 5 | 1 | 1% (wt.) | 110 | B** | 0.1% | (vol.) | 60° | 15 |
| 6 | 5 | 10% (vol.) | 110 | A | 3% | (wt.) | 25° | 20 |
| 7 | 5 | 10% (vol.) | 110 | A | 0.3% | (wt.) | 25° | 15 |
| 8 | 7 | 5% (wt.) | 110 | A | 0.3% | (wt.) | 25° | 15 |
| 9 | 6 | 5% (wt.) | 110 | A | 0.3% | (wt.) | 25° | 15 |
| 10 | 5 | 1% (vol.) | 110 | B | 0.1% | (vol.) | 100° | 15 |
| 11 | 5 | 1% (vol.) | 194 | B | 0.1% | (vol.) | 100° | 15 |
| 12 | 5 | 1% (vol.) | 195 | B | 0.1% | (vol.) | 100° | 15 |
| 13 | 5 | 1% (vol.) | 260 | B | 0.1% | (vol.) | 100° | 15 |
| 14 | 6 | 1% (wt.) | 110 | B | 0.5% | (vol.) | 100° | 15 |
| 15 | 6 | 1% (wt.) | 194 | B | 0.5% | (vol.) | 100° | 15 |
| 16 | 6 | 1% (wt.) | 195 | B | 0.5% | (vol.) | 100° | 15 |
| 17 | 7 | 1% (vol.) | 110 | B | 3% | (vol.) | 100° | 15 |
| 18 | 7 | 1% (vol.) | 110 | B | 1% | (vol.) | 100° | 15 |

*A = $Na_2Cr_2O_7$
**B = $HNO_3$

The treatments in the above specific examples were carried out by preparing aqueous solutions of the indicated compositions and maintaining at the stated temperature, and partially immersing clean strips of copper or copper alloy, about 0.5 inch in width, to a depth of about 1.5 inches for the stated time period. After immersion, each strip was rinsed in cold water and dried.

The coated strips were tested for resistance to tarnish by holding each sample in the vapor emerging from a freshly shaken bottle containing a 10 to 20 percent by weight aqueous solution of ammonium sulfide for 10 to 15 seconds, whereupon untreated or incompletely treated areas displayed mottled surface colors of metal sulfide much duller and darker than the uniform bright metallic color of the well-coated treated areas.

Each of the above 18 specific examples of yielded strips displaying perfect resistance to tarnish over the entire portion which had been immersed in the treating solution, as such portions after exposure to hydrogen sulfide vapor, retained the lustrous bright metallic color of the initial strip. This was in sharp contrast to the variegated murky and dark color shades shown by the unimmersed strip portions.

Such resistance to tarnish was found to be retained even after lengthy storage, as for 500 hours, in a laboratory cabinet.

The surface film produced on the metal strips by the immersion treatment is transparent and invisible to the naked eye, but its presence as a coating which is substantially free of pores is established through the improvements effected thereby in a number of properties, as illustrated by the vastly increased resistance to tarnish and the restoration of solderability to a desired extent.

Solderability tests were carried out on treated strips resulting from the above specific examples, and yielded the highest test rating without exception, even after lengthy storage of the treated strips in a laboratory cabinet, as for 500 hours. The solderability rating was similar to that observed in testing freshly cleaned initial metal strips which had not been coated.

The test rating was determined in accordance with the "Solder Dip Test", described on pages 57–58 of the article "Selecting Copper Alloys for Contact Resistance and Solderability" by S. H. Butt in Metals Engineering Quarterly, Vol. 12 (August, 1972), pages 55–62.

In this test, the strip is dipped into an alcohol solution of "Alpha Allros" No. 100 Flux, then immersed vertically in a bath of molten 60 Sn-40 Pb solder at 230° C. at a rate of 0.5 inch per second, held immobile in the bath for five seconds, withdrawn, cooled, and examined. The highest rating, Class I, is for a solder layer which is bright, smooth, and of uniform thickness, with no surface irregularities or gaps. Ratings of less perfect solderability fall in stages into Class II to Class V, the latter rating being applied to test samples displaying no surface adhesion to the solder.

The U.S. patents set forth in this application are intended to be incorporated by reference herein.

This invention may be embodied in other forms and modifications without departing from its spirit or essential characteristics. The present embodiments are, therefore, to be considered as illustrative of the invention, the scope of which is indicated by the appended claims, changes coming within the range of equivalency being intended to be embraced therein.

What is claimed is:

1. A method for producing a thin substantially invisible and pore-free film over a copper and copper alloy surface, said film providing increased resistance to tarnish and improved solderability to said surface, comprising:
   (a) providing a material selected from the group consisting of copper and copper alloys;
   (b) applying to said material a solution containing an organophosphonic acid and a chromate free oxidizing agent for at least 4 seconds to form said film as a surface coating of a compound of said organophosphonic acid;
   (c) rinsing said material; and
   (d) drying said material.

2. A method according to claim 1, wherein the said acid is a phosphonic acid having a structure derived by the replacement of one of the three hydroxyl groups of phosphoric acid by a hydrocarbon radical having a C atom linked directly to a P atom.

3. A method according to claim 1, wherein the said acid contains a monovalent hydrocarbon radical.

4. A method according to claim 1, wherein the said acid contains an alkyl group.

5. A method according to claim 1, wherein the said acid contains an acyl group.

6. A method according to claim 1, wherein the said acid contains a hydroxylalkyl group.

7. A method according to claim 1, wherein the organophosphonic acid solution is maintained at a temperature of about 20° C. to about 100° C.

8. A method according to claim 1, wherein the said solution is applied to said material for 4 to about 20 seconds.

9. A method according to claim 1, wherein the said acid is applied in aqueous solution at a concentration of about 0.1% to 40% by weight.

10. A method according to claim 1, wherein the said oxidizing agent is applied in aqueous solution at a concentration of about 0.1% to 15% by weight.

11. A method according to claim 1, wherein the said oxidizing agent is nitric acid.

12. A method according to claim 1, wherein the said oxidizing agent is applied to said material prior to applying said organophosphonic acid.

13. A method according to claim 1, wherein the said acid has the structure

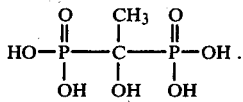

14. A method according to claim 1, wherein the said acid has the structure

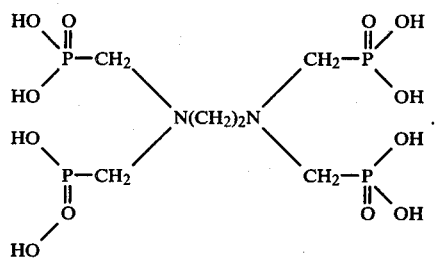

15. A method according to claim 1, wherein the said acid has the structure

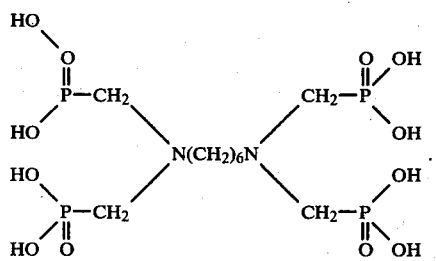

* * * * *